(12) United States Patent
Stegamat

(10) Patent No.: US 7,329,986 B2
(45) Date of Patent: Feb. 12, 2008

(54) ELECTROLUMINESCENT DISPLAYS AND METHOD OF FABRICATION

(75) Inventor: Reza Stegamat, Milpitas, CA (US)

(73) Assignee: OSRAM Opto Semiconductors GmbH (DE)

( * ) Notice: Subject to any disclaimer, the term of this patent is extended or adjusted under 35 U.S.C. 154(b) by 613 days.

(21) Appl. No.: 10/663,011

(22) Filed: Sep. 15, 2003

(65) Prior Publication Data
US 2005/0057153 A1    Mar. 17, 2005

(51) Int. Cl.
*H05B 33/00*    (2006.01)
(52) U.S. Cl. .................................................... 313/512
(58) Field of Classification Search ................. 313/512
See application file for complete search history.

(56) References Cited
U.S. PATENT DOCUMENTS

| | | | |
|---|---|---|---|
| 5,047,687 A | 9/1991 | VanSlyke | |
| 6,104,137 A | 8/2000 | Abiko et al. | |
| 6,520,821 B1 * | 2/2003 | Ishii et al. | 445/25 |
| 7,098,069 B2 * | 8/2006 | Yamazaki et al. | 438/99 |

OTHER PUBLICATIONS

Bredas et al., "Conjugated Polymers", The Novel Science and Technology of Highly Conducting and Nonlinear Optically Active Materials: Kluwer Academic Publishers, ISBN 0-7923-1403-4, pp. 3-35 (Copyright 1991).

* cited by examiner

*Primary Examiner*—Joseph Williams
(74) *Attorney, Agent, or Firm*—Dickstein, Shapiro, LLP.

(57) ABSTRACT

What is disclosed is an organic light emitting diode (OLED) based device which has been exposed to an environment including a mixture of gases and moisture in the form of water vapor, for a specified period of time prior to the device being encapsulated. The environment may contain oxygen, nitrogen, hydrogen, argon or atmospheric air or a combination thereof.

9 Claims, 5 Drawing Sheets

ELECTROLUMINESCENT DISPLAYS AND METHOD OF FABRICATION

BACKGROUND

1. Field of the Invention

This invention relates generally to the art of semiconductor devices. More specifically, the invention relates to manufacture of Organic Light Emitting Diode based displays and other active electronic devices.

2. Related Art

Display and lighting systems based on LEDs (Light Emitting Diodes) have a variety of applications. Such display and lighting systems are designed by arranging a plurality of photo-electronic elements ("elements") such as rows of individual LEDs. LEDs that are based upon semiconductor technology have traditionally used inorganic materials, but recently, the organic LED ("OLED") has come into vogue for certain applications. Examples of other elements/devices using organic materials include organic solar cells, organic transistors, organic detectors, and organic lasers.

The OLED is typically comprised of two or more thin organic layers (e.g., an electrically conducting polymer layer and an emissive polymer layer where the emissive polymer layer emits light) which separate an anode and a cathode. Under an applied forward potential, the anode injects holes into the conducting polymer layer, while the cathode injects electrons into the emissive polymer layer. The injected holes and electrons each migrate toward the oppositely charged electrode and produce an electro-luminescent emission upon recombination in the emissive polymer layer.

Each of the OLEDs can be a pixel element in a passive or active matrix OLED display. Such pixels can be arranged in a row-column fashion and would be addressed and switched on/off differently depending upon whether the display was active or passive matrix. In the passive matrix case, each pixel is not individually controlled, but rather an entire row of pixels is biased with respect to the intersecting column. When the difference between the voltage applied to the column (e.g. the anode) and the row (e.g. the cathode) is greater than the turn-on voltage, the pixel element at the intersection of the row and the column is illuminated. One obstacle in manufacturing of organic light emitting diodes is the high leakage current, which is defined as the amount of current flowing in the reverse direction when a forward bias is applied to a pixel. A high leakage current results in undesirable cross talk, i.e. illumination of the neighboring pixels when a particular pixel is addressed. While the exact nature of the cause of leakage current is not well-determined, in general, leakage current is caused by the presence of undesired conductive pathways formed during the fabrication process between the conductive polymer or the anode on one hand and the cathode materials on the other hand. The formation of the conductive pathways may simply be due to presence of a small hole in the emissive layer or due to the material build up against a photoresist edge during deposition or coating.

FIG. 1 illustrates a typical OLED-based passive matrix display during its manufacture. FIG. 1 is a side perspective view of a passive matrix OLED display 100 midway in the manufacturing process. Display 100 includes a patterned anode layer 102 (typically the columns) that are patterned on top of a glass substrate 101. Anode layer 102 is typically composed of a metal-oxide compound such as ITO (Indium Tin Oxide). After anode patterning (usually via a photolithography and etching step), metal lines (not shown) are deposited and patterned upon the anode pattern using methods known in the art (e.g. metal deposition, photolithography and etch).

Thereafter, cathode separators 110 are formed upon the surface of the substrate perpendicular to the ITO strips. These separators are typically photoresist layers that are patterned as shown using a photolithography technique. One of the purposes of the separators is to provide electrical separation of the individual rows of the top electrode layer, namely the cathode layer. FIG. 1 depicts a metal cathode layer 104 that is deposited by, for example, thermal evaporation, on top of various polymer layers (such as an emissive polymer layer 109 and a conducting polymer layer 108), to provide a complete conductive pathway for activating pixels which are subsequently formed. The intersection of cathode layer 104 and anode layer 102 creates a matrix of active pixels such as pixel 106 (shown with diagonal shading). The pixel 106 illuminates under an application of voltage which is forward biased as discussed above.

Long term exposure of OLED pixels to temperature, moisture and/or mechanical stress results in OLED degradation and malfunctioning, particularly is because of the polymer layers and the thin-film nature of the final assembly. Efficient OLED devices generally require the use of low work function materials for electron injection. These materials are typically metals such as Mg, Ca, Li, Ba, or metal halides such as LiF or CsF, which readily react with oxygen and water. A low work function calcium cathode, for example, survives only a short time in air due to rapid device degradation caused by atmospheric moisture and oxygen. Such highly reactive material can also undergo chemical reactions with the nearby organic materials present within the device, which can also have negative effects on the device. To protect the OLED pixels from environmental and mechanical damage, a cap 120 encapsulates the display 100 (usually over the substrate, shown but not enumerated). The encapsulation is in some instances performed by placing the cap 120 over a layer of epoxy (not shown) which covers the display 100. In other instances, the epoxy contains spacer particles which are used to separate the cap 120 from touching certain portions or all of the display 100. The shape of the cap 120 shown in FIG. 1 is merely illustrative, and may be any desired shape or form. The encapsulation cap 120 may be composed of a variety of materials, including but not limited to glass, ceramics, plastic or metals. The encapsulation technique may be mechanical or chemical or a combination thereof. The process of encapsulation is ordinarily carried out in a "glove box" environment. Often, a nitrogen gas ($N_2$) is used during encapsulation such that the gas is trapped under the encapsulating cap and fills the volume between the encapsulating cap and the display 100. Other gases have also been used for encapsulation. For example in U.S. Pat. No. 6,104,137 issued to Abiko et al. a method is disclosed wherein the OLED is encapsulated under oxygen, the purpose of which is to improve the leakage current in the OLED. Oxygen apparently reduces the prominence of leakage paths, but can also create undesirable effects such as adverse chemical reactions with the light emitting polymer and requires careful handling in a fabrication environment. Furthermore, oxygen is expensive and increases manufacturing costs.

Thus, it is highly desirable to provide alternative methods to reduce leakage current.

SUMMARY

An OLED display is exposed to an environment containing moisture for a specified length of time prior to the OLED display being encapsulated. After exposure, the OLED display is encapsulated under an encapsulation environment containing an inert gas such as nitrogen or argon or under a reactive gas such as oxygen or under a mixture of at least an inert and a reactive gas.

The moisture content in the exposure environment can vary from about 1% to 80%, for example. The amount of time the OLED display is exposed to the environment containing moisture can be controlled independently and is based upon the reactivity of the OLED display to the exposure environment. The reactivity of the OLED display depends on the level of moisture present during exposure and the characteristics of the various materials used in the OLED display. The environment to which the OLED display is exposed can also contain, in addition to moisture, any one gas or combination of gases that contains oxygen, atmospheric air, nitrogen, argon or hydrogen.

DETAILED DESCRIPTION OF THE INVENTION

Figure 1:
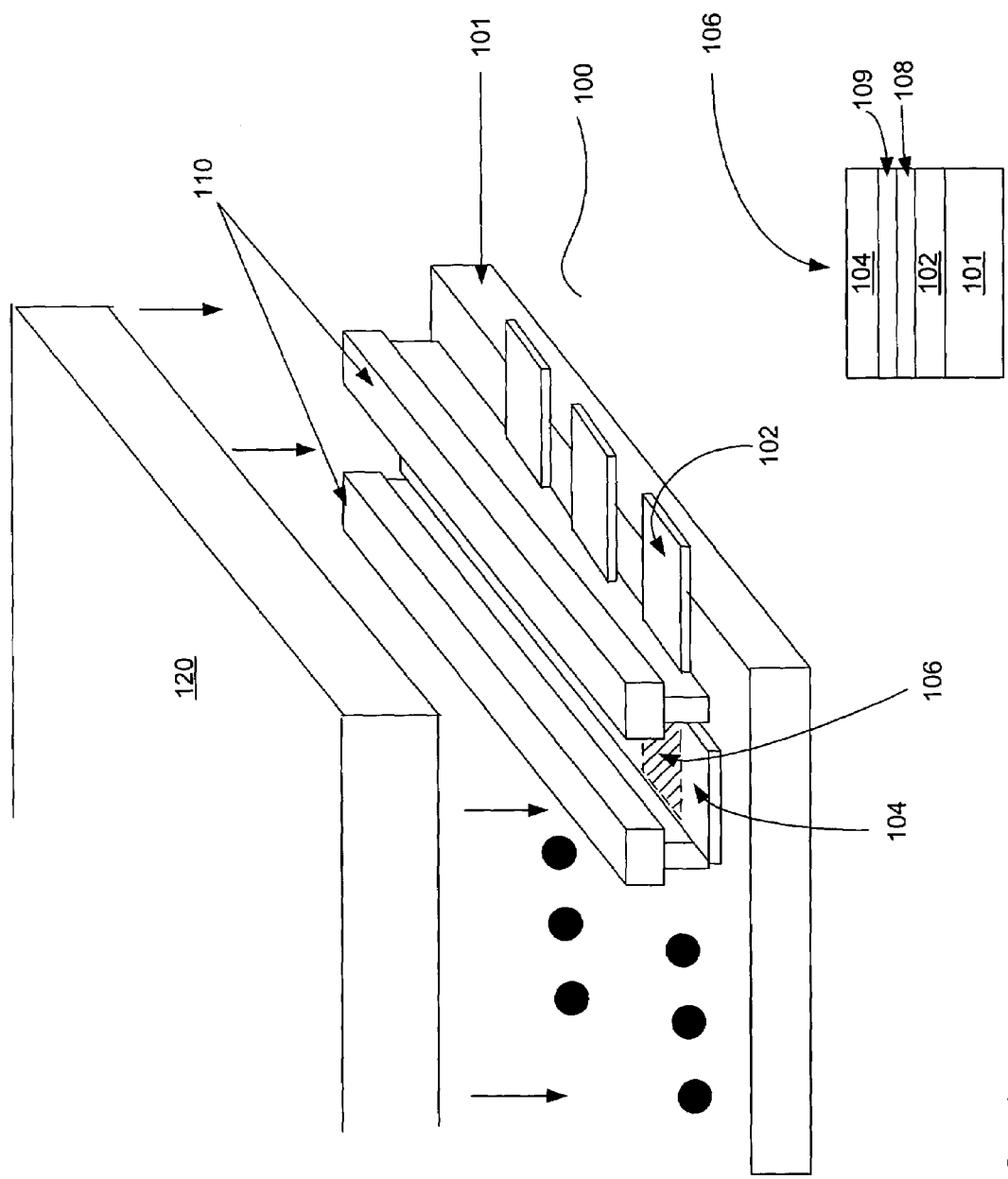
FIG. 1 illustrates a display device composed of OLED pixels.

According to at least one embodiment of the invention, an OLED display is exposed to an environment containing moisture for a specified length of time prior to encapsulation. After exposure to this environment, the OLED display is encapsulated under an inert gas such as nitrogen or argon or under a reactive gas such as oxygen or under a mixture of inert and a reactive gas In one embodiment, the percentage of moisture in the exposure environment can be for example from about 1% to 80% in concentration. The amount of time the OLED display is exposed to the environment containing moisture can be controlled independently and is based upon the reactivity of the OLED display to the exposure environment. The environment to which the OLED display is exposed can also contain, in addition to moisture, any gases such as oxygen, atmospheric air, nitrogen, argon or hydrogen.

In alternate embodiments of the invention, the OLED display can be exposed for a short duration of time to oxygen gas and then encapsulated under an inert gas such as nitrogen gas.

The invention's technique of exposing the "active areas" of an OLED device to an environment that includes moisture or oxygen prior to encapsulation can be applied to a variety of applications and devices. If the device is to be used as a backlight, the electrodes may be in a, continuous form, rather than patterned as rows and columns. Alternatively, only one of the two electrodes may be patterned. In this embodiment the second electrode can form a "blanket" or continuous sheet, that may be used in active-matrix OLEDs, alpha-numeric displays, and other segmented displays. The present invention can also be used in cases where the anode layer is deposited last and the cathode layer is first patterned/deposited on the substrate. The active areas include the substrate, electrodes as well as layers of organic material that may be sandwiched between the electrodes.

Additionally, the techniques of the present invention could be used in a vast array of applications including, but not limited to: active matrix, passive matrix, segmented, alpha-numeric, TFT, and backlit LED or OLED displays. Further, the present invention can be applied to any electronic device such as arrays of organic transistors, detectors, solar cells, and light sources, including backlights. These all have different active areas which can be exposed to an environment containing moisture prior to device encapsulation.

In one embodiment of the present invention, the active areas of the electronic device are fabricated by a variety of processing techniques such as vacuum thermal evaporation, sputtering, spin-coating, patterning, photolithography and/or other techniques known in the art. After the active areas are fabricated or during one or more fabrication steps, the electronic device is placed in an environmental chamber such as a glove box where the exact conditions and content of the environment within can be controlled and monitored. The electronic device is then exposed to an environment that contains moisture for a specified length of time. In one embodiment of the present invention, the exposure environment that includes a certain percentage of moisture (in the form of water vapor) could simply be atmospheric air. The length of time of exposure is dependent on the concentration of moisture present and the reactivity of the materials used in the electronic device. In general, the concentration of moisture used and the length of time of exposure are inversely related. The length of time of exposure should not be too long as to create adverse reactions between the exposure environment and the materials constituting the electronic device, but be long enough to beneficially reduce potential leakage current.

After the exposure step, the electronic device is encapsulated under an encapsulation environment. In one embodiment of the present invention, the controlled environment contains an inert gas or a mixture of inert gases such as argon or nitrogen. In another embodiment, the encapsulation environment contains reactive gases such as oxygen or hydrogen. In yet another embodiment of the present invention, the controlled environment contains a mixture of inert gases such as argon or nitrogen and a reactive gas such as oxygen. Various methods can be used to encapsulate an electronic device. For example, a hermetically sealed device can be formed by dispensing a UV- or thermally-curable adhesive onto the perimeter of the electronic device and subsequently placing an encapsulation cap over the adhesive followed by curing the adhesive under a UV lamp or in an oven.

In alternate embodiments of the present invention, the electronic device can be exposed instead to oxygen for a specified period of time and then encapsulated under an inert gas such as nitrogen.

Figure 2:
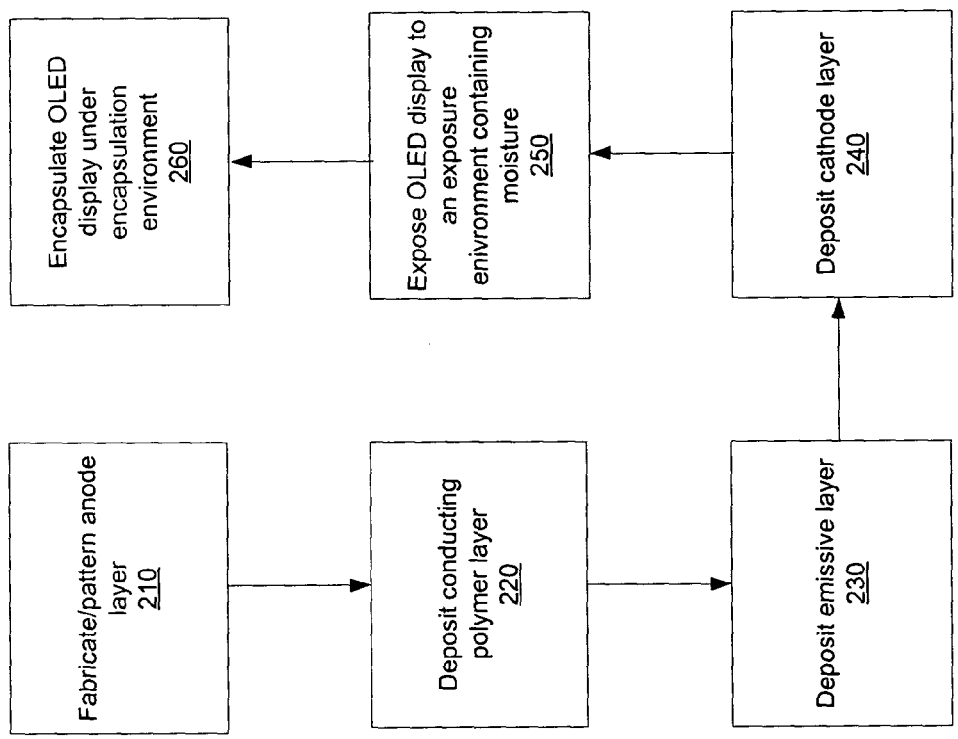
FIG. 2 illustrates a detailed workflow of manufacturing an OLED display in accordance with at least one embodiment of the present invention.

As discussed herein, the electronic device for which the technique of exposure was tested is an OLED display composed of an array of individual OLEDs. A more detailed description for fabrication of an OLED display in accordance with the present invention is illustrated in FIG. 2. First, an anode layer is patterned over a substrate (step 210).

The anode layer is usually thin enough so as to be semi-transparent and allow light transfer. As such, any thin-film deposition method may be used in the fabricating anode. These include, but are not limited to, vacuum evaporation, sputtering, electron beam deposition, chemical vapor deposition, and other techniques known in the art. Other steps, such as the formation of cathode separators, the addition of metal lines connecting the anode layer to power, and so on, are not shown as they are not germane to the invention.

Next, the conducting polymer layer is deposited (step 220). The conducting polymer layer is used to enhance the hole injection and thus the OLED efficiency The conducting polymer layer is usually applied as solution using techniques such as spin coating, dip coating, roll coating, spray coating or thermal evaporation. In other instances, the conducting polymer layer may also be applied using printing techniques such as inkjet printing or screen printing.

The next step is to deposit the emissive layer (step 230). The emissive layer is responsible for the emission of light from the OLED and is thus an electroluminescent, semiconducting type material. Examples of emissive polymers include but are not limited to copolymers, derivatives and moieties of polyfluorene, polyphenylenevinylene, polyarylenevinylene, and polyquinoline (see below for a detailed explanation).

Alternatively, rather than polymers, small organic molecules that emit light under an applied potential can serve as the organic electroluminescent layer. Examples of small-molecule organic electroluminescent materials include but not limited to: (i) tris(8-hydroxyquinolinato) aluminum (Alq); (ii) 1,3-bis(N,N-dimethylaminophenyl)-1,3,4-oxidazole (OXD-8); (iii) -oxo-bis(2-methyl-8-quinolinato)aluminum; (iv) bis(2-methyl-8-hydroxyquinolinato) aluminum; (v) bis(hydroxybenzoquinolinato) beryllium (BeQ.sub.2); (vi) bis(diphenylvinyl)biphenylene (DPVBI); and (vii) arylamine-substituted distyrylarylene (DSA amine).

Such polymer and small-molecule materials are well known in the art and are described in, for example, U.S. Pat. No. 5,047,687 issued to VanSlyke, and in Bredas, J.-L., Silbey, R., eds., "Conjugated Polymers", Kluwer Academic Press, Dordrecht (1991).

The polymer and small molecule emissive materials and the fabrication/deposition thereof are well-known in the art and are not specifically the subject of the present invention. Optional layers which are used in aiding the injection of electrons into the emissive layer may also be deposited (not shown).

After the emissive layer is deposited, the cathode is formed/deposited (step 240). The cathode is typically consist of thin layer of a low work function material such as barium or calcium and a backing layer such as aluminum. The cathode layers are usually deposited using vacuum evaporation or similar techniques known in the art.

Once all of the active layers (e.g. the anode layer, organic layers, and cathode layer) are formed/deposited, the OLED display is then exposed for a specified period of time to an environment containing moisture (step 250). This environment includes a certain percentage of moisture in the form of water vapor but may also contain other gases such as oxygen, nitrogen or argon. One example of such an environment would be atmospheric air. The OLED display is exposed in an environmentally controlled chamber such as a glove box after the OLED display is removed from the evaporator or other fabrication apparatus. The time of exposure can be from a few seconds to tens of minutes, depending upon the level of moisture present and the reactivity of the active area to the presence of moisture. The time of exposure can also be for example from about a few seconds to a few hours, but most preferably a few second to thirty minutes. As mentioned above, in at least one embodiment of the present invention, the environment to which the OLED display is exposed is the atmospheric air, which ordinarily contains about 30-60 percentage moisture. The exposure time can be controlled carefully so as not to allow device degradation or undesired reactions between the display materials and moisture. Experimental case studies (presented below) have shown that the amount of leakage current is substantially reduced without adversely affecting the lifetime or efficiency of the OLEDs when the OLED display is exposed to moisture in the manner discussed above.

After the OLED display is exposed to the environment containing moisture, it is then encapsulated under another gas or mixture of gases ("encapsulation environment") (step 260). The encapsulation cap, as described above, may be a plastic, metal or glass and may be bonded by adhesive to the substrate or to spacers that extend from the substrate/OLED display. The encapsulation cap is airtight and includes a cavity. The cavity is between the inner surface of the encapsulation cap and the surfaces of the OLED display. The encapsulation process is carried out in a controlled environment under at least one inert gas, at least one reactive gas or at least one inert and one reactive gas. In accordance with the present invention, the controlled environment used to encapsulate the OLED display may be the same environment or a different environment from the exposure environment. The encapsulation environment may be oxygen, nitrogen, atmospheric air or a combination thereof. Since the OLED display is exposed to atmospheric air in some embodiments of the present invention prior to encapsulation, the encapsulation could be carried out in the same atmospheric air if appropriate. Thus, the encapsulation environment and the exposure environment may be one and the same or entirely different, depending upon what is desired and what yields an acceptable OLED. Experimental results of such encapsulation are discussed below.

In alternate embodiments of the present invention, the OLED display is exposed to oxygen rather than moisture (at step 250) and then encapsulated under an inert gas such as nitrogen (at step 260).

Figure 3:
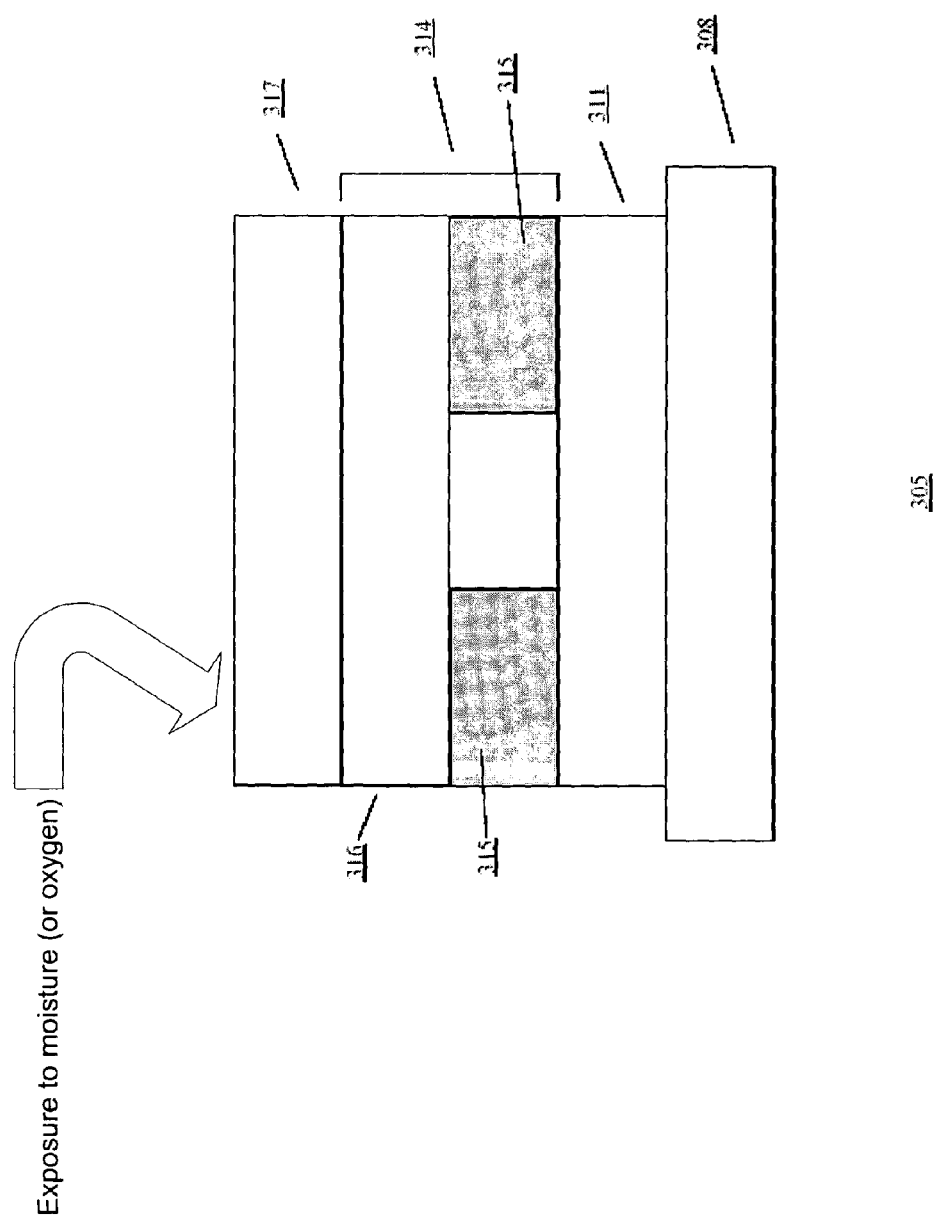
FIG. 3 illustrates a cross-section of active layers of an organic electronic device fabricated in accordance with the present invention.

FIG. 3 illustrates a cross-section of active layers of an organic electronic device fabricated in accordance with the invention. The electronic device 305 includes a substrate 308 and a first electrode 311 on the substrate 308. The first electrode 311 may be patterned for pixilated applications or unpatterned for backlight applications. If the electronic device 305 is a transistor, then the first electrode may be, for example, the source and drain contacts of that transistor. The electronic device 305 also includes a semiconductor stack 314 on the first electrode 311. The semiconductor stack 314 includes at least the following: (1) first efficiency enhancing layer 314 and (2) an active electronic layer 316. If the first electrode 311 is an anode, then the first efficiency enhancing layer 315 are multiple substantially electrically isolated conducting polymer regions on the first electrode 311, and the active electronic layer 316 is on the multiple substantially electrically isolated conducting polymer regions 315. Alternatively, if the first electrode 311 is a cathode, then the active electronic layer 316 is on the first electrode 311, and the multiple substantially electrically isolated conducting polymer regions 315 are on the active electronic layer 316. The electronic device 305 also includes a second electrode 317 on the semiconductor stack 314. If the electronic device 305 is a transistor, then the second electrode 317 may be, for example, the gate contact of that transistor. Other layers than that shown in FIG. 3 may also be added including insulating layers between the first electrode 311 and the semiconductor stack 314, and/or between the semiconductor stack 314 and the second electrode 317. In accordance with the present invention, the electronic device 305 is exposed to an environment containing moisture (or alternatively oxygen) prior to encapsulation of electronic device 305. The layers which comprise the electronic device 305 when the device is an OLED are described in greater detail below.

Substrate (308)

Substrate 308 can be any material, which can support the layers, and is transparent or semi-transparent to the wavelength of light generated in the device. Substrate 308 can also be opaque in top-only emitting devices. By modifying or filtering the wavelength of light which can pass through the substrate, the color of light emitted by the device can be changed. Preferable substrate materials include glass, quartz, silicon, and plastic. The preferred thickness of substrate 308 depends on the material used and on the application of the device. The substrate can be in the form of a sheet or continuous film, such as used for roll-to-roll manufacturing processes, which are particularly suited for plastic, metal, and metallized plastic foils.

First Electrode (311)

First electrode 311 can be transparent, semi-transparent, or opaque to the wavelength of light generated within the device. In one embodiment, first electrode 311 functions as an anode when an electric potential is applied across the first electrode and second electrode 317. When an electric potential is applied across first electrode 311 and second electrode 311, which can serve as a cathode, photons are released from active electronic layer 316 that pass through first electrode 311 and substrate 308.

Many materials that can function as an anode are known to those of ordinary skill in the art. A composition that includes indium tin oxide (ITO) is preferred at present. Suitable glass substrates pre-coated with ITO may be purchased from Applied Films Corporation, 9586 I-25 East frontage Rd., Longmont, Colo., USA 80504.

Preferably, the thickness of the first electrode 311 is from about 10 to about 1000 nanometers (nm), more preferably from about 50 to about 200 nm, and most preferably is about 100 nm. While many methods are known to those of ordinary skill in the art by which the first electrode material can be deposited, evaporative or sputtering methods are preferred, with sputtering methods being particularly preferred at present.

First Efficiency Enhancing (or Conducting Polymer) Layer (315)

To enhance the photon yield of the device in relation to the electric potential applied, optional efficiency enhancing layers may be disposed between first electrode 311 and active electronic layer 316. While many materials, which can function as an efficiency-enhancing layer are known to those of ordinary skill in the art, conducting polymers are preferred as a first efficiency enhancing layer 315. Preferred conductive polymers include, but are not limited to Baytron P (available from H. C. Starck, Germany) and polyaniline (PANI).

Preferably, the thickness of first efficiency enhancing layer 315 is from about 5 to about 1000 nanometers (nm), more preferably from about 20 to about 500 nm, and most preferably from about 50 to about 250 nm.

First efficiency enhancing layer 315 is usually applied in the form of a solution. Many application and variations of the methods discussed in the present invention are well known to those of ordinary skill in the art. Examples include, but are not limited to, spin coating, dip coating, roll coating, spray-coating, blade coating, or thermal evaporation onto first electrode 311. Printing techniques including, but not limited to, screen-printing, flexographic printing, and ink-jet printing (drop-on-demand, continuous, or semi-continuous) may also be used to apply efficiency enhancing layer 315.

Active Electronic (or Emissive) Layer (316)

Active electronic layer 316 can include one or more layers. Active electronic layer 316 includes an active electronic material. Active electronic materials can include a single active electronic material, a combination of active electronic materials, or multiple layers of single or combined active electronic materials. Preferably, at least one active electronic material is organic.

For organic LEDs (OLEDs), the active electronic layer 316 contains at least one organic material that emits light. These organic light emitting materials generally fall into two categories. The first category of OLEDs, referred to as polymeric light emitting diodes, or PLEDs, utilize polymers as part of active electronic layer 316. The polymers may be organic or organometallic in nature. As used herein, the term organic also includes organometallic materials. Preferably, these polymers are solvated in an organic solvent, such as toluene or xylene, and spun (spin-coated) onto the device, although other methods are possible. Devices utilizing polymeric active electronic materials in active electronic layer 316 are especially preferred. In addition to materials that emit light, active electronic layer 316 may include a light responsive material that changes its electrical properties in response to the absorption of light. Light responsive materials are often used in detectors and solar panels that convert light energy to electrical energy.

Preferred polymeric light emitting materials include those materials that emit by fluorescence or by phosphorescence. In one aspect, the polymer is dispersed in a matrix, such as a poly(methylmethacrylate) matrix, for example. In another aspect the polymer is combined with an organic material.

More preferred polymeric light emitting materials include, but are not limited to, derivatives, copolymers, and polymeric blends that include polyparaphenelenevinylene moieties. More preferred polymeric emitting materials also include, but are not limited to, derivatives, copolymers, and polymeric blends that include polyfluorene moieties. More preferred phosphorescent polymers include, but are not limited to, those including benzophenones, benzophenones derivatives, benzophenones moieties, and mixtures thereof.

An especially preferred polymeric emitting material that emits yellow-light and includes polyphenelenevinylene derivatives is available as SY132 from Covion Organic Semiconductors GmbH, Industrial park Hoechst, Frankfurt, Germany. Another especially preferred polymeric emitting material that emits green-light and includes fluorine-based copolymers is available as Lumation Green 1300 series from Dow Chemical, Midland, Mich.

In addition to polymers, smaller organic molecules that emit by fluorescence or by phosphorescence can serve as a light emitting material residing in active electronic layer 316. Unlike polymeric materials that are applied as solutions or suspensions, small-molecule light emitting materials are preferably deposited through evaporative, sublimation, or organic vapor phase deposition methods. Combinations of PLED materials and smaller organic molecules can also serve as active electronic layer. For example, a PLED may be chemically derivatized with a small organic molecule or simply mixed with a small organic molecule to form active electronic layer 316.

Many preferable small-molecule light emitting materials are known to those of ordinary skill in the art. More preferred small-molecule emitting materials are organic or organometallic compounds including, but not limited to: quinolates, aluminum quinolate, triazines, oligomers, dendrimers, spiro-compounds, and mixtures thereof. Quinoline moieties derivatized with aluminum are especially preferred.

Preferably, the thickness of active electronic layer 316 is from about 5 to about 500 nanometers (nm), more preferably from about 20 to about 100 nm, and most preferably is about 75 nm.

In addition to active electronic materials that emit light, active electronic layer 316 can include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, compositions including C60, and compositions including derivatized C60 may be used. Active electronic layer 341 may also include semiconductors, such as silicon or gallium arsenide.

Second Efficiency Enhancing Layer (Not Shown)

An optional second efficiency enhancing layer (not shown) preferably comprises a material capable of injecting electrons when the device is energized. It may be distinct from, or integrated with, the second electrode 317. More preferably, it includes a low work function material, such as barium, calcium, magnesium, alkali halide compounds and mixtures thereof, for example.

Preferably, the thickness of second efficiency enhancing layer is from about 0.1 to about 50 nanometers (nm), more preferably from about 0.5 to about 10 nm, and most preferably from about 0.5 to about 5 nm. Second efficiency enhancing layer is preferably applied by evaporative methods, but other methods known to those of ordinary skill in the art, such as sputtering or casting from a solution, could also be utilized.

Second Electrode (317)

In one embodiment, second electrode 317 functions as a cathode when an electric potential is applied across the first electrode 311 and second electrode 317. In this embodiment, when an electric potential is applied across the first electrode 311, which serves as the anode, and second electrode 317, which serves as the cathode, photons are released from active electronic layer 316 that pass through first electrode 311 and substrate 308.

While many materials, which can function as a cathode, are known to those of skill in the art, most preferably a composition that includes aluminum, indium, silver, gold, magnesium, calcium, and barium, or combinations thereof, or alloys thereof, is utilized. Aluminum, aluminum alloys, and combinations of magnesium and silver or their alloys are especially preferred.

Preferably, the thickness of second electrode 317 is from about 10 to about 1000 nanometers (nm), more preferably from about 50 to about 500 nm, and most preferably from about 100 to about 300 nm. While many methods are known to those of ordinary skill in the art by which the first electrode material may be deposited, vacuum deposition methods, such as physical vapor deposition (PVD) are preferred.

Other layers (not shown) such as a barrier layer and getter layer may also be used to protect the electronic device. Such layers are well-known in the art and are not specifically discussed herein.

Figure 4:
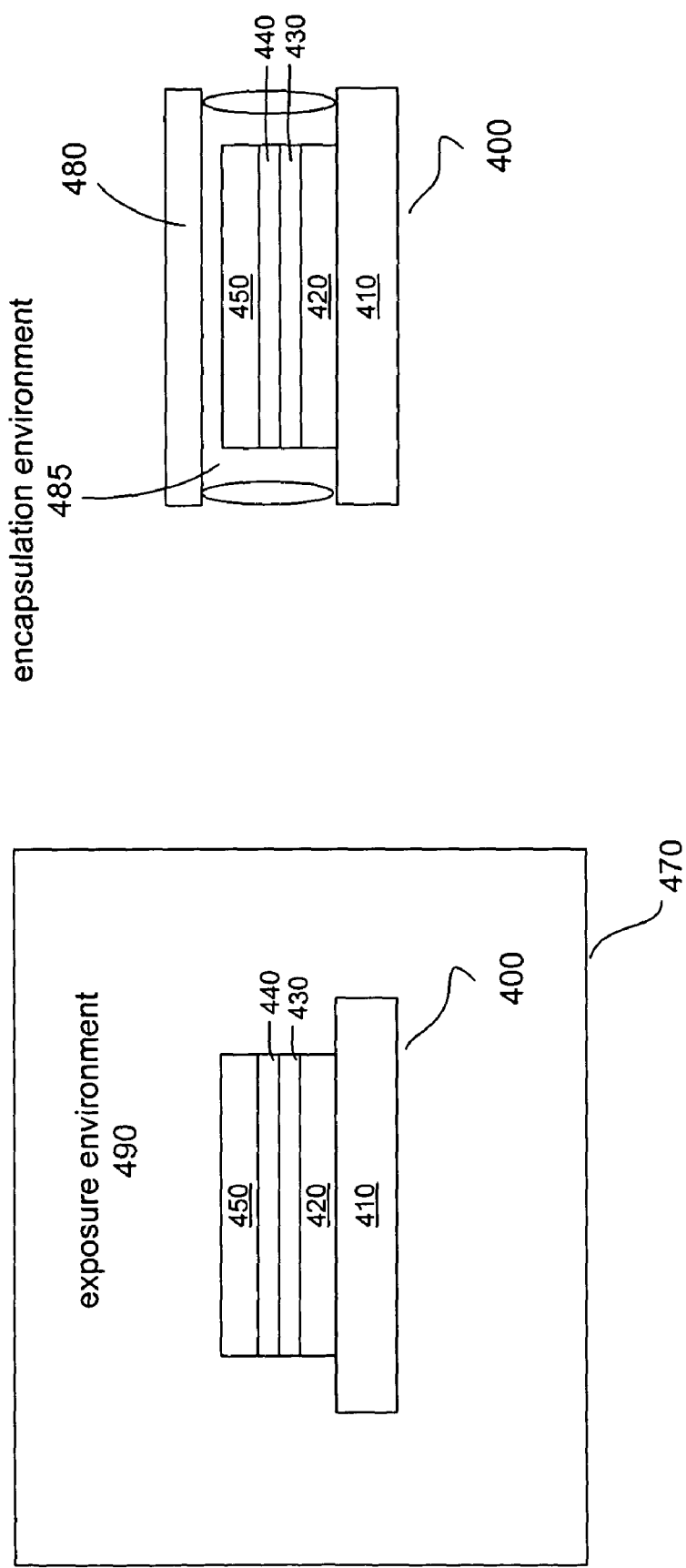
FIG. 4 illustrates an OLED device manufactured using the techniques disclosed in accordance with at least one embodiment of the present invention.

FIG. 4 illustrates an OLED manufactured using the techniques disclosed in the present invention. The OLED 400 is shown as a cross-section of a single OLED for convenience only. According to the present invention, the exposure to moisture and subsequent encapsulation of OLED 400 is extended to an OLED display or other device which contains an array of such OLEDs. An OLED 400 consists essentially of a substrate 410 upon which an anode 420 is deposited or patterned. Above anode 430 are a conducting polymer layer 430 followed by an emissive layer 440. Over the anode 420 and polymer layers 430 and 440, a cathode layer 450 is deposited. According to one embodiment of the present invention, OLED 400 is placed into an environmentally controlled chamber 470 such as a glove box. The chamber 470 has an exposure environment 490 which may be created by adding into the chamber 470 moisture in the form of water vapor and, optionally, gases such as oxygen, nitrogen or atmospheric air.

The OLED 400 is held in the chamber 470 and exposed to the exposure environment 490 for a specified period of time. This exposure is in addition to the normal permanent exposure to nitrogen or other gases that the OLED 400 experiences after being encapsulated. Once the exposure period is completed, the OLED 400 is then encapsulated in an encapsulation environment 485 containing one or more gases. The encapsulation process involves bonding an encapsulation cap 480 (such as glass) to the substrate 410 where exposed and above the cathode layer 450. The encapsulation cap 480 creates an airtight covering about the OLED 400 such that the gases of the encapsulation environment 485 are trapped under the cap 480. In at least one embodiment of the invention, the exposure environment 490 and the encapsulation environment 485 are different in composition. In yet other embodiments of the invention, the exposure environment 490 and encapsulation environment 485 may be identical or nearly identical in composition. Furthermore, the arrangement and composition of the layers 410, 420, 430 and 440 are merely exemplary and can be rearranged, added upon or reduced as desired by the specific application for the OLED 400. For instance, the anode layer 410 and cathode layer 440 may be transposed in position without impacting the applicability of the invention.

In alternate embodiments of the invention, the exposure environment 490 is one of oxygen gas ($O_2$), while the encapsulation environment 485 contains at least one inert gas such as for example nitrogen ($N_2$).

The OLED 400, thus constructed shows reduced levels of leakage current without any undue adverse effect to the performance of the OLED 400. Case studies performed on exposure of a particular OLED to various sources has yielded the results shown in FIG. 5 and in Table 1 below.

Case Studies

Four sets of OLEDs with sample sizes for each set varying from 5 to 11 were constructed as follows.

EXAMPLE A

Control

A first set of OLEDs, all having the same structures, were made as detailed below. A 120 nm of the first efficiency enhancing conductive polymer layer made of Baytron P (batch number CH8000, available from H. C. Starck, Germany), was spin-coated from an aqueous solution onto ITO-coated glass substrates. The active emissive layer made of SY132 solution (available from Covion, Germany) was subsequently spin-coated onto the first efficiency enhancing conductive polymer layer, wherein the thickness of the active emissive layer was 70 nm. This step was immediately followed by vacuum thermal evaporation of the second efficiency enhancing layer onto the active emissive layer, wherein the second efficiency enhancing layer was made of 3 nm of barium. After formation of the second efficiency enhancing layer, the cathode layer was deposited onto the second efficiency enhancing layer by vacuum thermal evaporation method, wherein the cathode was made of 250 nm of aluminum.

Finally, after cathode deposition devices were removed from the evaporation chamber and encapsulated in the glove box under nitrogen. These devices were controls and, therefore, were not exposed to any exposure environment after cathode deposition. After encapsulation, the electro-optical and lifetime stability performances of the devices were measured.

EXAMPLE B

A second set of OLEDs, all having the same structures, were made as detailed below. A 120 nm of the first efficiency enhancing conductive polymer layer made of Baytron P (batch number CH8000, available from H. C. Starck, Germany), was spin-coated from an aqueous solution onto ITO-coated glass substrates. The active emissive layer made of SY132 solution (available from Covion, Germany) was subsequently spin-coated onto the first efficiency enhancing conductive polymer layer, wherein the thickness of the active emissive layer was 70 nm. This step was immediately followed by vacuum thermal evaporation of the second efficiency enhancing layer onto the active emissive layer, wherein the second efficiency enhancing layer was made of 3 nm of barium. After formation of the second efficiency enhancing layer, the cathode layer was deposited onto the second efficiency enhancing layer by vacuum thermal evaporation method, wherein the cathode was made of 250 nm of aluminum.

Finally, after cathode deposition devices were removed from the evaporation chamber and exposed to the atmospheric air for 5 minutes, wherein the percent relative humidity in the atmospheric air was about 50%. After exposure to air, the devices were encapsulated in the glove box under nitrogen. After encapsulation, the electro-optical and lifetime stability performances of the devices were measured.

EXAMPLE C

A third set of OLEDs, all having the same structures, were made as detailed below. A 120 nm of the first efficiency enhancing conductive polymer layer made of Baytron P (batch number CH8000, available from H. C. Starck, Germany), was spin-coated from an aqueous solution onto ITO-coated glass substrates. The active emissive layer made of SY132 solution (available from Covion, Germany) was subsequently spin-coated onto the first efficiency enhancing conductive polymer layer, wherein the thickness of the active emissive layer was 70 nm. This step was immediately followed by vacuum thermal evaporation of the second efficiency enhancing layer onto the active emissive layer, wherein the second efficiency enhancing layer was made of 3 nm of barium. After formation of the second efficiency enhancing layer, the cathode layer was deposited onto the second efficiency enhancing layer by vacuum thermal evaporation method, wherein the cathode was made of 250 nm of aluminum.

Finally, after cathode deposition devices were removed from the evaporation chamber and exposed to the atmospheric air for 5 minutes, wherein the percent relative humidity in the atmospheric air was about 50%. After exposure to air, the devices were encapsulated in air. After encapsulation, the electro-optical and lifetime stability performances of the devices were measured.

EXAMPLE D

A fourth set of OLEDs, all having the same structures, were made as detailed below. A 120 nm of the first efficiency enhancing conductive polymer layer made of Baytron P (batch number CH8000, available from H. C. Starck, Germany), was spin-coated from an aqueous solution onto ITO-coated glass substrates. The active emissive layer made of SY132 solution (available from Covion, Germany) was subsequently spin-coated onto the first efficiency enhancing conductive polymer layer, wherein the thickness of the active emissive layer was 70 nm. This step was immediately followed by vacuum thermal evaporation of the second efficiency enhancing layer onto the active emissive layer, wherein the second efficiency enhancing layer was made of 3 nm of barium. After formation of the second efficiency enhancing layer, the cathode layer was deposited onto the second efficiency enhancing layer by vacuum thermal evaporation method, wherein the cathode was made of 250 nm of aluminum.

Finally, after cathode deposition devices were removed from the evaporation chamber and exposed to a gas mixture containing about 20% oxygen and 80% nitrogen for 20 minutes. After exposure to the gas mixture, the devices were encapsulated in the same environment as the exposure environment. After encapsulation, the electro-optical and lifetime stability performances of the devices were measured.

TABLE 1

Case studies of Exposure and Encapsulation

| Case | Exposure Environment | Encapsulation Environment | ½ life @ 80 C. Hours | Cd/A @ 3000 nits | Sample Size |
|---|---|---|---|---|---|
| A | None | $N_2$ (control) | 218 ± 8.0 | 7.27 | 7 |
| B | Air | $N_2$ | 234 ± 7.5 | 7.9 | 7 |
| C | Air | Air | 220 ± 6.4 | 7.5 | 11 |
| D | $O_2/N_2$ | $O_2/N_2$ | 230 ± 10 | 7.5 | 5 |

Figure 5:
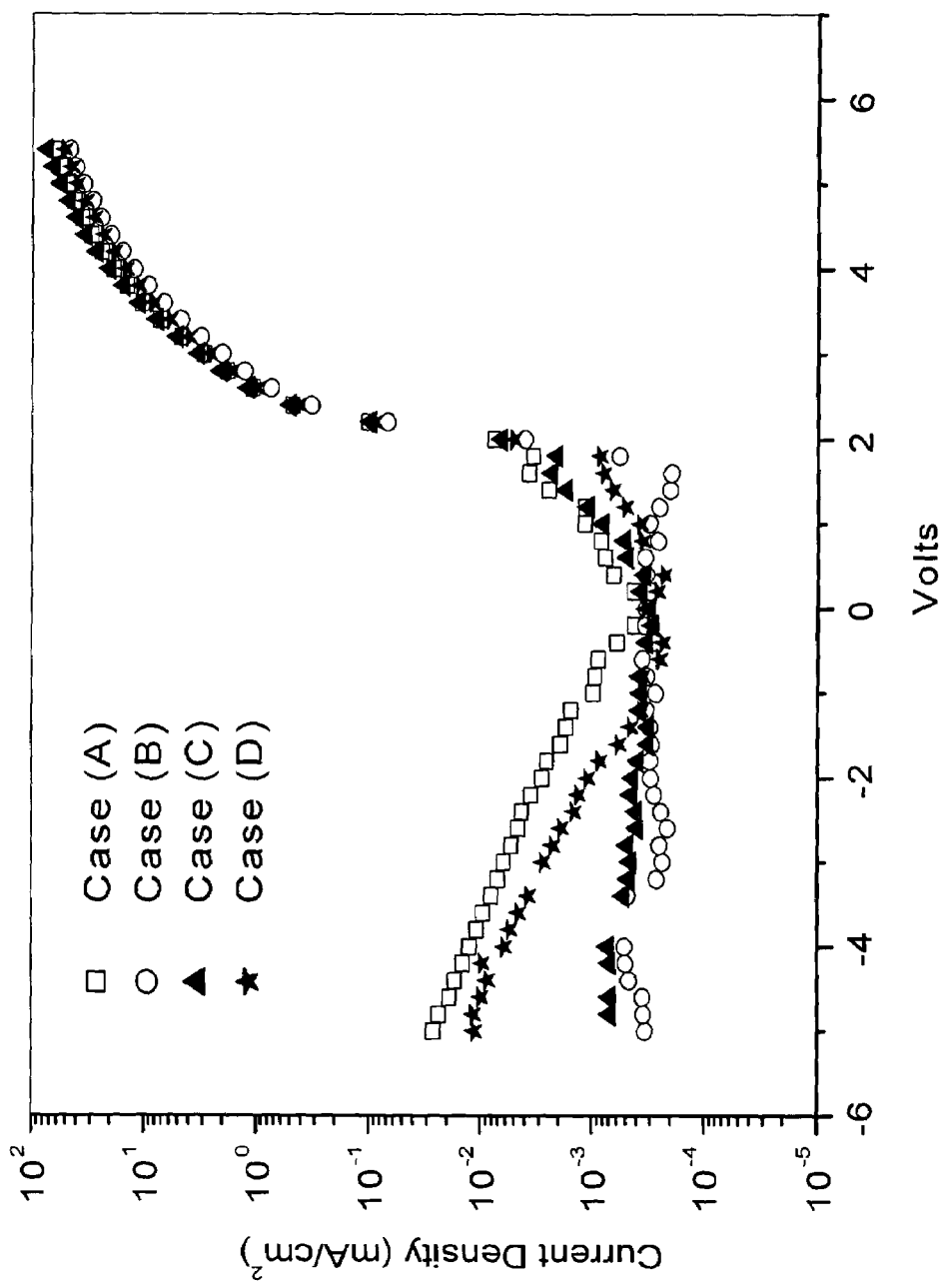
FIG. 5 illustrates current-voltage characteristics of OLEDs prepared under various conditions.

Referring to Table 1 and FIG. 5, it is clear that all devices performed as good or better than the control. In the case (B), where the devices were exposed to air and encapsulated in nitrogen best performance was obtained; both halflife (time to reach half of the initial luminance) and the luminous efficiency (Cd/A, candelas per ampere) showed significant improvements. The leakage current reduced by two orders of magnitude from $2\times10^{-2}$ to $2\times10^{-4}$ mA/cm$^2$ at −5 volts—a substantial improvement in the reduction of leakage current. In the case (C), where the devices were exposed and encapsulated in air, significant enhancement was also observed in the reduction of leakage current. In this case, the halflife and efficiency were found comparable or better than the control, which indicated no adverse effect on the device performance as a results of exposure to air for the specific period of time mentioned above. In the case (D), where the devices were exposed and encapsulated in the gas mixtures, the leakage current was reduced, however, not as significantly as in the other cases. In this case, the halflife and efficiency showed improvement with respect to the control which indicated no adverse effect on the device performance as a results of exposure to the gas mixture.

As discussed above, the exposure of OLEDs to the atmospheric air, which contained moisture, for a specific time period, resulted in a substantial improvement in the leakage current without compromising the device performance, namely the halflife and the efficiency. However, as it is obvious to a person of the ordinary skill in the art, long time exposure of active organic devices such as OLEDs to moisture will result in the formation of dark spots and irreversible device degradation. Dark spots are defined as the non-emitting areas in an emitting pixel and are formed by migration of moisture to defect sites leading to local separation of the cathode from the emissive layer, thus producing a non-emitting site. According to at least one embodiment of the present invention the exposure of the active organic devices to a gas containing moisture must be performed in a controlled fashion. One important aspect of the present invention is to control the exposure time and the percent moisture in the exposure environment. The higher the moisture content in the exposure environment the shorter the exposure time must be. These two parameters need to be determined for a particular environment and laboratory setting. As shown above, by controlling these two parameters, the leakage current can be significantly reduced without any adverse effect on the device performance.

What is claimed is:

1. An apparatus comprising: a substrate; at least one active element, said active element fabricated on said substrate; and an encapsulation cap attached to said substrate protecting and covering said element from environmental exposure, wherein said element has been exposed to an exposure environment containing moisture in the form of water vapor for a specified period of time prior to said encapsulation cap being bonded, and wherein said encapsulation cap traps a gas mixture between said element and said encapsulation cap, wherein said gas mixture includes oxygen.

2. An apparatus according to claim 1 wherein said gas mixture contains additionally at least one of nitrogen, hydrogen, atmospheric air and argon.

3. An apparatus according to claim 1 wherein the percentage of moisture is between 1% and 80% by volume.

4. An apparatus according to claim 1 wherein said exposure environment includes at least one of oxygen, nitrogen, atmospheric air, hydrogen and argon.

5. An apparatus according to claim 1 wherein said active element comprises at least one emissive layer, said element causing said emissive layer to emit light using an applied electric potential.

6. An apparatus according to claim 5 wherein said active element further comprises: an anode layer, said anode layer transporting holes to said emissive layer; and a cathode layer, said cathode layer transporting electrons to said emissive layer, said transported holes and electrons recombining in said emissive layer to cause said emissive layer to emit light.

7. An apparatus according to claim 5 wherein said emissive layer is composed of an at least partially organic material.

8. An apparatus according to claim 1 wherein said specified period of time ranges from about a few seconds to a few hours.

9. An apparatus according to claim 1 wherein said specified period of time ranges from approximately a few seconds to thirty minutes.

* * * * *

UNITED STATES PATENT AND TRADEMARK OFFICE
CERTIFICATE OF CORRECTION

PATENT NO. : 7,329,986 B2  
APPLICATION NO. : 10/663011  
DATED : February 12, 2008  
INVENTOR(S) : Reza Stegamat Page 1 of 1

It is certified that error appears in the above-identified patent and that said Letters Patent is hereby corrected as shown below:

In the Specification:

At column 2, line 24, "particularly is because" should read --particularly because--

At column 3, line 48, "gas" should read --gas.--

At column 7, line 55, "layer" should read --layers--

At column 8, line 41, "polyparaphenelenevinylene" should read --polyparaphenylenevinylene--

At column 8, line 49, "polyparaphenelenevinylene" should read --polyparaphenylenevinylene--

Signed and Sealed this

Tenth Day of June, 2008

JON W. DUDAS  
*Director of the United States Patent and Trademark Office*